(12) United States Patent
Zhang et al.

(10) Patent No.: US 8,478,218 B2
(45) Date of Patent: *Jul. 2, 2013

(54) FREQUENCY MODULATION (FM) CLEAR CHANNEL SCANNING SYSTEM AND METHOD OF USING SAME

(75) Inventors: Yifeng Zhang, San Jose, CA (US); Tracey Lee Chavers, San Jose, CA (US); Peiqi Xuan, Saratoga, CA (US); Qifa Wu, Beijing (CN)

(73) Assignee: Quintic Holdings, George Town, Grand Cayman (KY)

( * ) Notice: Subject to any disclaimer, the term of this patent is extended or adjusted under 35 U.S.C. 154(b) by 797 days.

This patent is subject to a terminal disclaimer.

(21) Appl. No.: 12/137,535

(22) Filed: Jun. 11, 2008

(65) Prior Publication Data

US 2009/0311982 A1    Dec. 17, 2009

(51) Int. Cl.
*H04B 1/18*    (2006.01)
*H04B 7/00*    (2006.01)
*H04W 4/00*    (2009.01)
*H04W 72/00*    (2009.01)

(52) U.S. Cl.
USPC ............... 455/161.1; 455/161.3; 455/434; 455/452.2; 455/513

(58) Field of Classification Search
USPC ....... 455/434, 515–516, 150.1, 154.1–154.2, 455/158.1, 160.1, 161.1–166.2, 168.1, 176, 455/179.1–180.2, 184.1, 185.1, 186.1, 188.1–118.2, 450–452.2, 509, 513
See application file for complete search history.

(56) References Cited

U.S. PATENT DOCUMENTS

| | | | | |
|---|---|---|---|---|
| 6,038,433 A * | 3/2000 | Vegt | | 455/161.1 |
| 6,538,704 B1 * | 3/2003 | Grabb et al. | | 348/731 |
| 7,221,412 B2 * | 5/2007 | Shibusawa | | 348/732 |
| 7,643,807 B2 * | 1/2010 | Gupta et al. | | 455/179.1 |
| 7,689,217 B2 * | 3/2010 | Ruelke et al. | | 455/434 |
| 7,729,698 B2 * | 6/2010 | Soliman | | 455/436 |
| 2003/0025623 A1 * | 2/2003 | Brueske et al. | | 341/139 |
| 2006/0222116 A1 * | 10/2006 | Hughes et al. | | 375/345 |
| 2007/0087683 A1 * | 4/2007 | Hsieh et al. | | 455/3.01 |
| 2007/0146555 A1 * | 6/2007 | Wada | | 348/732 |
| 2008/0014934 A1 * | 1/2008 | Balasubramanian et al. | 455/434 |
| 2008/0233907 A1 * | 9/2008 | Ibrahim et al. | | 455/183.2 |
| 2009/0279508 A1 * | 11/2009 | Tod et al. | | 370/335 |

* cited by examiner

*Primary Examiner* — Simon Nguyen
(74) *Attorney, Agent, or Firm* — Maryam Imam; IPxLaw Group LLP

(57) ABSTRACT

A scan system receives signals within a band from an antenna and divides the band into sub-bands and scans the channels of each sub-band to determine a candidate channel based on the lowest figure of merit (FOM) and includes an on-channel selection block responsive to a received digital signal and operative to select only the on-channel frequencies and to substantially disregard the out-of-channel frequencies from the digital signal. The scan system generates a FOM on-channel signal representing a measurement of the signal quality of the on-channel signal and includes an out-of-channel selection block responsive to the digital signal and operative to select only the out-of-channel frequencies and to substantially disregard the on-channel frequencies from the digital signal and operative to generate a FOM out-of-channel signal representing a measurement of the signal quality of the out-of-channel signal.

35 Claims, 6 Drawing Sheets

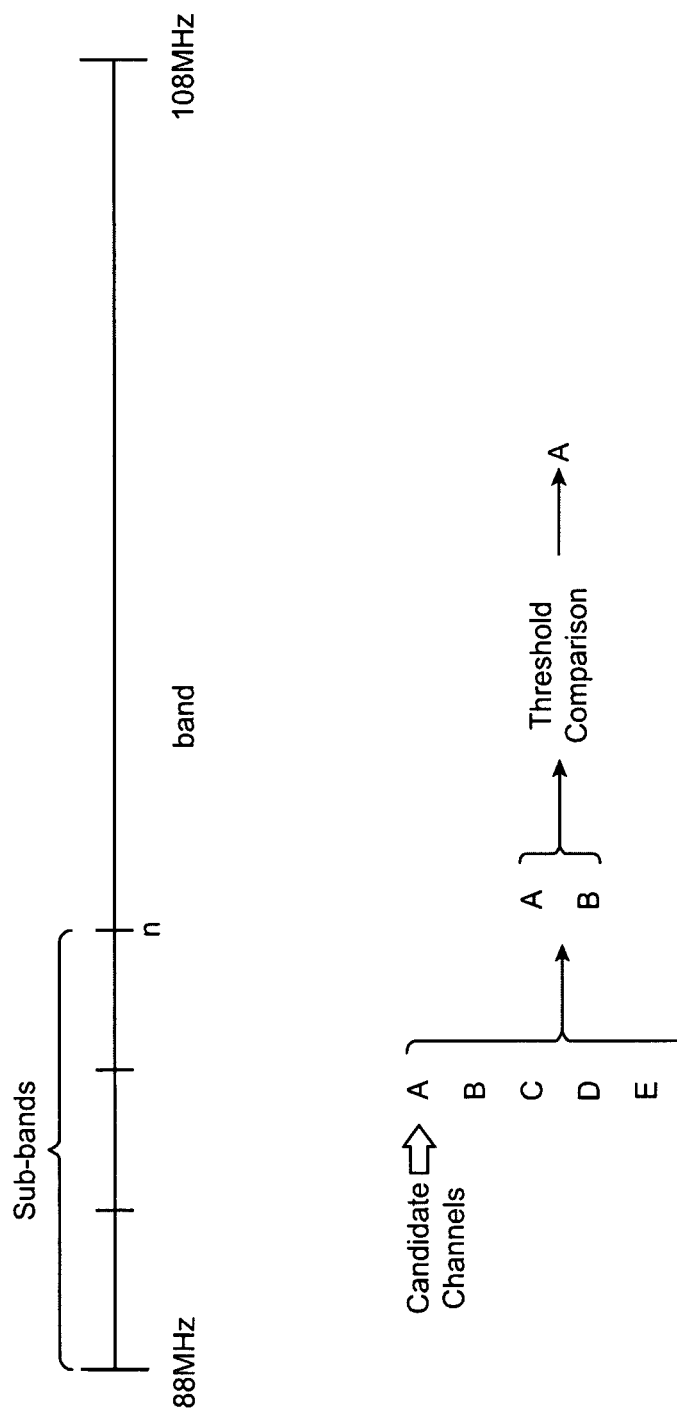

FREQUENCY MODULATION (FM) CLEAR CHANNEL SCANNING SYSTEM AND METHOD OF USING SAME

FIELD OF THE INVENTION

The present invention generally relates to transmitters and receivers and particularly to a system and method for using same for scanning and finding an unoccupied channel of a band.

DESCRIPTION OF THE PRIOR ART

Scanning for and finding an unoccupied or vacant channel for transmission and avoiding interference with licensed broadcast or other undesirable channels is highly desirable in an effort to increase efficiency and quality and to take advantage of such available channels.

As an example, currently, in the United States, the frequency modulation (FM) broadcast band falls generally within 87.8 to 108.0 megahertz (MHz). Existing FM scanning systems use spectrum analysis to identify vacant (or available) channels. In doing so, a received signal strength indicator (RSSI) is used. The RSSI is a measurement of the power present in a received radio signal. The RSSI typically consists of a one-byte integer value. A value of 1 indicates the minimum signal strength detectable, while a value of 0 indicates no detectable signal. Current scanning systems identify vacant channels based solely on the RSSI measurement. If the RSSI is higher than a specified threshold, then the candidate channel is identified as occupied, and if the RSSI is lower than a specified threshold, the candidate channel is identified as vacant. This strategy fails to take into account of the RSSI of neighboring occupied channels. Open (or available) channels surrounded by neighboring channels with high RSSI strengths require greater receiver performance for clear reception. However, open channels without high RSSI strength neighbors are received clearly by receivers with lesser performance capability.

Existing scanning systems fail to accurately identify open channels with low RSSI strength neighbors. Existing scanning systems search for open channels by making a single pass through the entire range. This method of scanning is time consuming, and suffers from poor accuracy.

Stated differently, conventional scanning methods and systems measure the on-channel signal level of each channel in a band, such as a frequency modulation (FM) band and choose the channel with the lowest on-channel signal level as the best channel for transmission. This technique however, fails to take into account the adjacent and alternative channel conditions and the receiver need have very good frequency selectivity for a good reception. Also, this method has a large variation of channel scan. In each scan, a different channel is located because several unoccupied channels may have the same on-channel signal level, the measurement ambiguity leads to different results in different scan. A frequent user interactive is thus required in real application which is undesirable. To reduce the variation, a long scan time is used for each channel, thus, the full band scan undesirably takes a very long time.

Existing scanning systems also fail to utilize past scan results when identifying open and occupied channels. Because different channels may have different strengths at different distances, each scan of the range may return with different results. Therefore, the reliability of the scanning results suffers because the results of past scans go unutilized.

In light of the foregoing, the need arises for a scanning system with improved accuracy, speed, and reliability.

BRIEF SUMMARY OF THE INVENTION

Briefly, an embodiment of the present invention includes a scan method and system for receiving signals within a band from an antenna and dividing the band into sub-bands and scanning the channels of each sub-band to determine a candidate channel based on the best figure of merit (FOM) and includes an on-channel selection block responsive to a received signal and operative to select only the on-channel frequencies and to substantially disregard the out-of-channel frequencies from the received signal. The scan system generates a FOM of on-channel signal representing a measurement of the signal quality of the on-channel signal and includes an out-of-channel selection block responsive to the received signal and operative to select only the out-of-channel frequencies and to substantially disregard the on-channel frequencies from the received signal and operative to generate a FOM of out-of-channel signal representing a measurement of the signal quality of the out-of-channel signal.

The foregoing and other objects, features and advantages of the present invention will be apparent from the following detailed description of the preferred embodiments which make reference to several figures of the drawing.

BRIEF DESCRIPTION OF THE DRAWINGS

These and other features, aspects, and advantages of the present invention will be better understood with regard to the following description, appended claims, and accompanying drawings as follows:

FIG. 6 shows a conceptual diagram of an example of sub-bands and the best channel within an FM band ranging from 88 mega Hz to 108 mega Hz.

DETAILED DESCRIPTION

Figure 1:
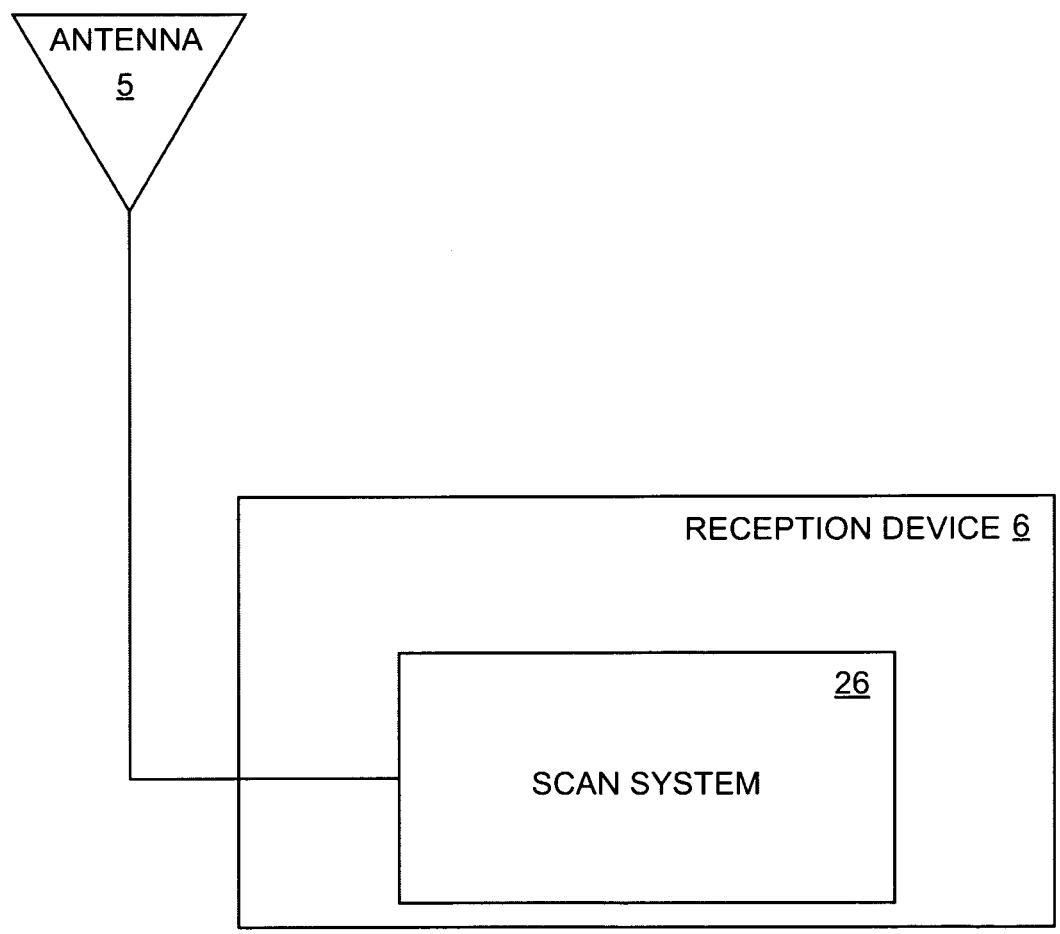
FIG. 1 shows block diagram of reception device 6.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1 to 5. However, those skilled in the art will readily appreciate that the detailed description given herein with respect to these figures is for explanatory purposes as the invention extends beyond these limited embodiments.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

An embodiment of the present invention uses adjacent and alternative channel conditions to find a vacant or unoccupied channel within a band. Different decision metric is used to find the best channel. In one embodiment, hysteresis is used to resolve the variation of channel scan problem. Two fast signal level detectors are used, one to measure the on-channel signal level and another to measure the signal level of adjacent and alternative (or out-of-channel) channel signal levels. Scanning of channels within the band is done by initializing a search to compare the on-channel signal level, Vs, of a particular channel with a predetermined threshold, Vith. If it is determined that Vs is larger than or equal to Vith, the particular channel is rejected, however, if Vs is smaller than Vith, the signal to adjacent and alternative channel level ratio, CIR, is compared with a predetermined threshold CIRth. If CIR is less than CIRth, the signal level Vs is compared to find the channel with the lowest signal level and found channel is declared the best channel. The signal level of the best channel is recorded. In a following scan, the signal level of the best channel is first read and compared with a recorded value and if there is no increase detected by a predetermined value, Vhys, the current best channel is used and nothing is updated, however, if the change is higher than Vhys, the process returns and continues from the initial searching step.

Referring now to FIG. 1, a block diagram of reception device 6 is shown in accordance with an embodiment of the present invention. Reception device 6 is shown to include scan system 26, which is shown, coupled to an antenna 5.

In some embodiments, the reception device 6 and the system 26 are the same physical device. In other embodiments, the reception device 6 includes structures in addition to the scan system 26, such as analog filters and the like and therefore, the device 6 includes the scan system 26.

The scan system 26 has numerous applications among which include but are not limited to scanning for an available frequency modulation (FM) channel among the FM channels or scanning for an available amplitude modulation (AM) channel or scanning for an available wide band channel. It is understood that other types of broadcast or bands are anticipated in which the scan system 26 may be employed.

The antenna 5 is operative to receive certain signals, such as but not limited to FM, AM or other frequency bands. Scan system 26 is operative to identify open (or available or vacant) and occupied (unavailable) channels in a band, and to relay such information to the remaining parts of the reception device 6. Reception device 6 is operative to utilize the open and occupied channel information provided by system 26 to provide the user of device 6 with selectable access to the available occupied channels within a range of channels. While the system 26 is shown to be physically included in the reception device 6, it is understood that it may be located externally to the reception device 6.

In an alternative embodiment, reception device 6 allows a user thereof to select among unoccupied channels for use with small-scale transmitters. Such transmitters include a range of device, such as but not limited to, digital audio encoding format (MP3) players and other similar devices to larger scale broadcasting systems used to transmit audio over a short distance. Examples of reception device 6 include any device that includes a radio receiver, such as but not limited to an MP3 player.

Figure 2:
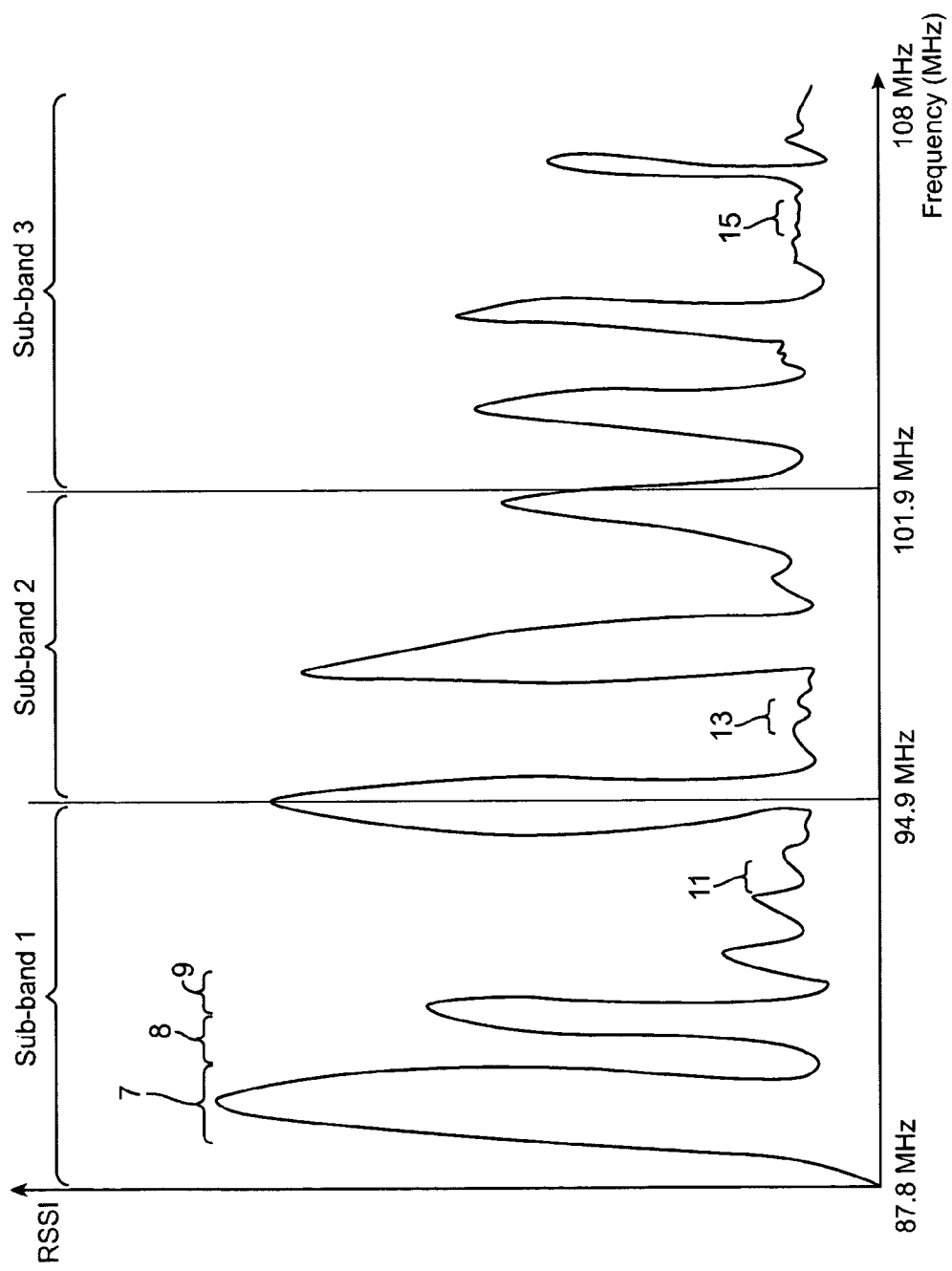
FIG. 2 shows an exemplary graph of received signal strength indicator (RSSI) on the y-axis and frequency in megahertz (MHz) on the x-axis.

FIG. 2 shows an exemplary graph of received signal strength indicator (RSSI) (an example of a quality measurement) on the y-axis and frequency in megahertz (MHz) on the x-axis. This graph shows the results of an exemplary search of the FM band by system 26, in accordance with an embodiment of the present invention, and therefore serves as one application, among many, of the system 26. System 26 is operative to divide the FM band into 'n' number of sub-bands, 'n' being an integer value, before measuring the RSSI value of the FM band.

It should be noted that RSSI is an example of a measurement of the quality of the signal and other types of measurements, such as signal-to-noise ratio (SNR), center frequency deviation or others known to those skilled in the art or any combinations thereof is contemplated. In this respect, RSSI, as used herein, is an example of figure of merit (FOM) or quality measurement representing a measurement of the signal quality.

Dividing the bands into 'n' number of sub-bands advantageously allows system 26 to measure the RSSI value (or FOM) more accurately and in a shorter time period when compared with scanning the entirety of the FM band from beginning to end, as done by prior art techniques. This is so because the sub-bands can be scanned with a finer granularity than is generally done when an entire band is scanned.

Additionally, system 26 uses a digital signal processor (DSP)-based adaptive signal strength measurement which is advantageously faster than the current conventional system used by existing scanning systems. A DSP-based signal strength measurement system that is adaptive allows for programmably-setting its coefficients, which advantageously provides for faster tuning thereby improving system performance.

FIG. 2 shows the FM range divided into three sub-bands: sub-band 1, sub-band 2, and sub-band 3. It is understood however, that the FM band may be divided into any number of sub-bands. Sub-band 1, in FIG. 2, ranges from 87.8 MHz to 94.9 MHz, sub-band 2 ranges from 95 MHz to 101.9 MHz, and sub-band 3 ranges from 102 MHz to 108 MHz. Note that the sub-dividing of the FM range in FIG. 2 is only illustrative and system 26 may divide the FM range into 'n' number of sub-bands, 'n' being an integer. Alternatively, the band may be other than an FM band, as previously indicated.

After dividing the FM band by 'n' number of sub-bands, system 26 is operative to scan each sub-band or a subset of 'n' number of sub-bands, a subset being one or more sub-bands, to determine a candidate channel within each scanned sub-band. A candidate channel is one with the best FOM, such as the lowest RSSI or SNR or other types of measurements, among the channels of the sub-band. Once a candidate channel for each sub-band is identified, next, for each candidate channel, a second FOM (such as the RSSI ratio of on-channel to out-of-channel, or other quality measurement) is determined.

In FIG. 2, RSSI is used as an example of FOM and on-channel 8 is shown to have adjacent (or neighboring) out-ofchannel 7 and out-of-channel 9. The on-channel to out-of-channel RSSI ratio measures the on-channel RSSI strength, as compared with the out-of-channel RSSI (or quality measurement) strength adjacent to the occupied channel. The on-channel to out-of-channel RSSI ratio is advantageously used in combination with the RSSI measurements by system 26 to identify the best open (or available) channel from amongst the best candidate channel of each sub-band. In summary, a first FOM is measured within each selected sub-band to find a candidate channel and next, a second FOM (for example, the on-channel to out-of-channel RSSI ratio, or SNR, or center frequency deviation or any combination of them) is measured for each of the candidate channels to determine the best channel among all or a subset of all candidate channels.

In FIG. 2, candidate open channel 11, candidate open channel 13, and candidate open channel 15 are shown to be the best open channels from among each respective sub-band. After identifying the best candidate open channel from each sub-band, system 26 selects the best candidate open channel from among all the sub-bands. In an example embodiment of the present invention, system 26 is implemented in hardware. However, it is contemplated that system 26 could also be implemented in software executed, for example, by a microcontroller host unit.

Stated differently, the system 26 scans each of the sub-bands 1, 2 and 3, and detects the best channel, within each sub-band, for transmission by measuring the on-channel RSSI. In this case, the channels 11, 13 and 15 are identified as the open channels for the sub-bands 1, 2 and 3, respectively. Next, the best channel among channels 11, 13 and 15 is identified by measuring the FOM of each and comparing the latter to determine the one with the best FOM (or quality measurement, such as RSSI) ratio.

It is noted that in an exemplary embodiment of the present invention, system 26 is operative to use both RSSI (or FOM) and the on-channel to out-of-channel RSSI ratio to select the best open channel from among the sub-bands. Alternatively, the user may modify the selection criteria so that only the RSSI (or FOM) or the on-channel to out-of-channel RSSI ratio are used exclusively to select the best open channel from among the sub-bands. Still alternatively, the on-channel to out-of-channel RSSI (or quality measurement) ratio may be used first and followed by the RSSI measurement.

Figure 3:
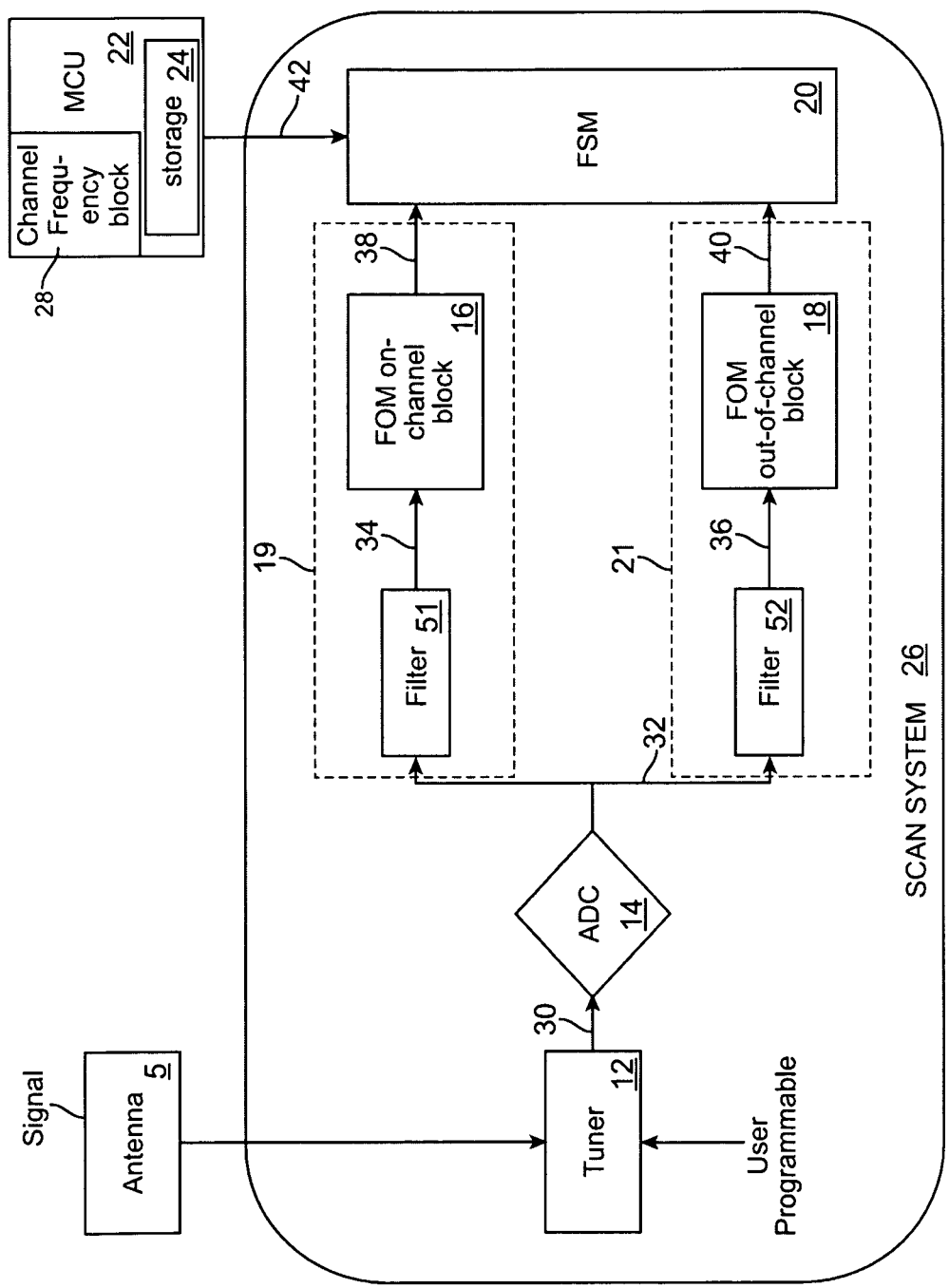
FIG. 3 shows a block diagram of FM clear channel scan system 2.

FIG. 3 shows a block diagram of the system 26, in accordance with an embodiment of the present invention. System 26 is shown to include tuner 12, analog-to-digital converter (ADC) 14, filter 51, filter 52, FOM of on-channel block 16, FOM of out-of-channel block 18 and finite state machine (FSM) 20. Antenna 5 and microcontroller unit (MCU) 22 are shown coupled to system 26. MCU 22 is shown to include storage 24 and channel frequency block 28. Antenna 5 is shown coupled to FM tuner 12. Tuner 12 is shown coupled to ADC 14. ADC 14 is shown coupled to both filter 51 and filter 52. Filter 51 is shown coupled to the block 16. The block 16 is shown coupled to FSM 20. Filter 52 is shown coupled to FOM out-of-channel block 18. Block 18 is shown coupled to FSM 20. When using the system 26 in an FM band application, the tuner 12 operates as an FM tuner. When using the system 26 in an FM band application, the tuner 12 operates as an FM tuner.

In some embodiments, the MCU 22 is located within the reception device 6. In other embodiments, the MCU 22 is located externally to the reception device 6. In some embodiments, the MCU 22 is part of the system 26 and in other embodiments, the MCU 22 is located externally to the system 26.

The filter 51 and the block 16 are collectively comprise the on-channel selection block 19. In some embodiments, the filter 51 and the block 16 are physically the same block and in other embodiments, they appear as in FIG. 3 as separate structures. The filter 52 and the block 18 collectively comprise the out-of-channel selection block 21. In some embodiments, the filter 52 and the block 18 are physically the same block and in other embodiments, they appear as in FIG. 3 as separate structures.

Antenna 5 is shown to receive the signal, in the form of an analog signal, and to transmit the same to the tuner 12. Tuner 12 receives the analog signal is operative to select a single station by excluding substantially all others and to generate a tuned analog signal 30 for use by the ADC 14. Tuner 12 is user-programmable to select a start and stop frequency range and a step frequency and in this manner divides the band into multiple sub-bands.

In an exemplary embodiment, the selected step frequency is 200 kHz or 400 kHz and the sub-band frequencies are as those shown in FIG. 2 and which are within the FM band. ADC 14 is operative to receive the signal 30 and to convert the same to digital signal 32. The signal 32 is then coupled onto filter 51 and filter 52. Filter 51 is designed to select substantially only the on-channel frequencies and to substantially disregard the out-of-channel frequencies from the signal 32 to generate the on-channel signal 34. Filter 52 is operative to select substantially only the out-of-channel frequencies and to substantially disregard the on-channel frequencies from the signal 32 to generate the out-of-channel signal 36.

Filter 51 is further operative to transfer the on-channel signals 34 to the block 16. The block 16 is operative to measure the FOM of the on-channel signals 34 (a measurement representing the measurement of signal quality of the on-channel signal), and the block 18 is operative to measure the out-of-channel signals 36 (a measurement representing the measurement of signal quality of the out-of-channel signal). In one embodiment of the present invention, both blocks 16 and 18 use an adaptive time constant which advantageously allows for fast user-programming of settings (such as coefficients) and fast FOM calculation.

A scan of the band performed at a low bandwidth yields more accurate results, as more noise is removed, than a scan at a high bandwidth. However, scanning with the high bandwidth is less time-consuming to complete. System 26 advantageously uses an adaptive time constant to yield accurate scans of the FM band in a short amount of time. The adaptive time constant changes to produce a scan that is very fast initially and then becomes increasingly slower. In an exemplary embodiment, the scan is performed at least five times faster than that realized by prior art techniques. The block 16 is operative to generate an FOM on-channel signal 38 and the block 18 is operative to generate an FOM out-of-channel signal 40, both of which are received by the FSM 20.

MCU 22 is operative to ultimately select the best candidate open channel. MCU 22 records the FOM (second FOM) measurements from filter 51 and filter 52 and calculates the on-channel to out-of-channel FOM ratio. More specifically, the signals 38 and 40 are used to calculate the on-channel to out-of-channel FOM ratio of these signals by dividing the signal 38 by the signal 40. MCU 22 is further operative to compare the on-channel to out-of-channel FOM ratio to a programmable (predetermined) threshold value. If the calculated ratio is above the threshold, the channel is selected, and if the ratio is below the threshold, the channel is not selected. Alternatively, this comparison may be done by comparing the ratio to being above or equal to the threshold and/or less than or equal thereto.

The FSM 20 is operative to perform the initial sub-band scan. That is, it compares the FOM (a first FOM measurement) of each of the channels within a sub-band to determine a candidate channel based on the channel with the lowest FOM. It is noted that alternatively, rather than performing the initial sub-band channel scan prior to the FOM that is performed for adjacent channels of the candidate channels, the initial sub-band channel scan may be done after the adjacent FOM channel determination. In one embodiment, the first FOM measurement is performed prior to the second FOM measurement. In another embodiment, the second FOM measurement is performed prior to the first FOM measurement.

It should be noted that practically, a hysteresis type of threshold is preferred in that rather than a specific value determining the threshold, the threshold is a range below which, the channel is selected and above which the channel is not selected or vice versa. In one embodiment of the present invention, MCU 22 is operative to compare the on-channel to out-of-channel FOM ratio to a hysteresis range of thresholds having an upper range and a lower range, wherein the FOM ratio being below the range indicates that the channel is to be selected, and the FOM ratio being above the range indicates that the channel is not to be selected.

MCU 22 is operative to integrate the hardware-based system 26 with block 28 and storage 24. Both block 28 and storage 24 are included in the MCU 22, in an exemplary embodiment. It is understood however, that they may be executed elsewhere or each on a different platform. Block 28 is operative to specify the start and stop frequency range and step frequency used by system 26 and optionally to maintain a history of "best" channel and update the same periodically. Storage 24 is operative to store past open channel search results. Storage 24 is optional but when used improves tuning by allowing for a more accurate selection of an open channel because periodic scans are performed and used to compare to a previous (or current) "best" channel and if an improvement is noted over the current best channel, the best channel is updated to be the that which showed an improvement. In this manner, a history is maintained and "best" channel is updated to track the current surroundings of the system 26. This is advantageous particularly when the system 26 is used in a portable device and the location of the portable device changes.

Figure 4:
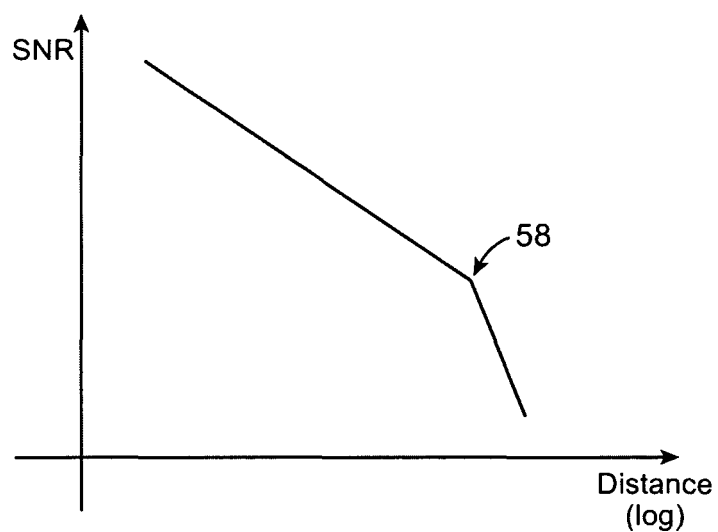
FIG. 4 shows a graph of the signal-to-noise (SNR) ratio of a station (shown in the y-axis) versus distance, shown in logarithmic scale (shown in the x-axis).

FIG. 4 shows a graph of the signal-to-noise (SNR) ratio of a station (shown in the y-axis) versus distance, shown in logarithmic scale (in the x-axis). As the portable device housing the system 26 travels from one city to another, its SNR drops significantly thereby rendering the current "best" channel desirable for use in transmitting information. Drop-off point 58 represents the maximum distance from the signal source before the SNR drops significantly. Maintaining a history of channels yields such result and causes updating the "best" channel to one matching the traveled destination. In embodiments using a history of "best" channels, the block 28 performs the steps of FIG. 5.

Figure 5:
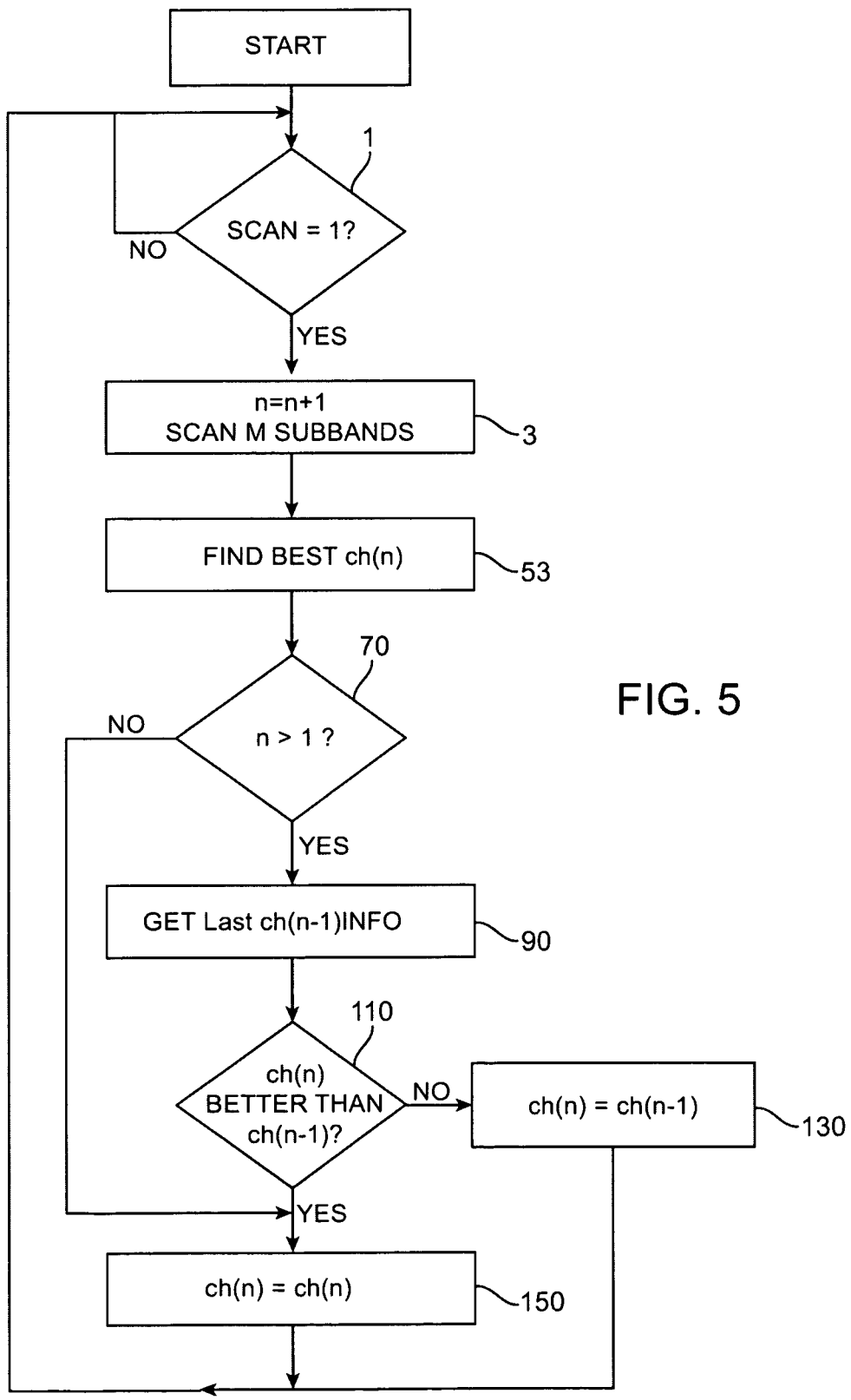
FIG. 5 shows a flowchart illustrating steps performed by a channel frequency block.

FIG. 5 shows a flowchart illustrating the steps performed by block 28 when scanning one of the sub-bands, in accordance with an embodiment of the present invention. After starting the process, at 1, it is determined whether or not this is the first scan. The number of scans is represented by 'n'. If this is not there is no scan, the process continues back to 1 and repeats until a scan is detected and the process continues to step 3. At step 3, 'n' is incremented by one to reflect the scan number. 'M' number of sub-bands is noted and are scanned. Next, at step 5, the best channel for the nth scan is detected using the in-channel to out-of-channel RSSI calculation discussed above. Next, at 7, it is determined whether or not 'n' is larger than one or this is not the first scan and if not, the process continues to step 9, otherwise, the process continues to step 15.

At step 9, the "best" channel of the last scan is obtained and at 11, the "best" channel of the latest scan is compared to the current "best" channel scan and if the latter is greater or larger than the former, the process continues to step 15 where the "best" channel is updated to be the current "best" channel scan and replaces the "best" channel of the latest scan. Next, the process continues to 1. If at 11, it is determined that the "best" channel of the latest scan is the larger or better than the current "best" channel scan, the process continues to step 13 where the "best" channel is not updated and the latest scan continues to be the "best" channel and the process continues to 1.

FIG. 6 shows a conceptual diagram of an example of sub-bands and the best channel within an FM band ranging from 88 mega Hz to 108 mega Hz. A scan of sub-bands, performed by the FSM 20, for candidate channels yields channels A, B, C, D, E and F. The scan may be done of all 'n' sub-bands within the band shown or it may be done within a single sub-band in which case repeated scans scan the same sub-band multiple times. In the case where the scan is performed within a single sub-band, six scans are performed within the sub-band. In the case where the scan is performed of more than one sub-band, 'n' may be less than the entire band and if there is no best channel ultimately determined, another subset of sub-bands within the band is attempted. In the case where a single sub-band is scanned, if no best channel is ultimately determined, another sub-band is attempted. In the case where multiple subsets of sub-bands are scanned, the subsets need not but may be sequential in order. Similarly, in the case of the scan being within a sub-band, the next sub-band to be attempted may or may not be the next sequentially-ordered sub-band.

In FIG. 6, once the candidate channels are determined, next, the candidate channels are compared with respect to their adjacent/alternative channel behavior, as described hereinabove and in FIG. 6, channels A and B are the channels that have the best adjacent channel results. Next, a threshold comparison is performed yielding channel A as being the "best" channel for transmission. It is noted that if no such best channel is determined, for example, none passes the threshold test, a next subset of sub-bands is scanned. Due to the foregoing multiple measurements, the quality of transmission is advantageously improved. That is, not only are channels qualified based on their FOM, rather, their adjacent channels are factored into the measurement as well as the use of a threshold value.

Accordingly, the system 26 scans for and transmits on an unoccupied channel, within a band, to avoid interference with licensed broadcast or other undesirable interferences and it does so by optimizing the quality of transmitted signals by taking into account the adjacent and alternative channel conditions.

While various applications of the system 26 are contemplated, portable applications of the system 26 particularly lead to choosing the best channel because the environment and therefore signal quality continues to change.

Thus, in accordance with the various embodiments of the present invention, a method of scanning a radio band is disclosed. The band includes one or more sub-bands. The sub-bands may occupy the entire band or a subset of the band and may be sequential or not. The method includes scanning each of the sub-bands for a candidate channel, the candidate channel having substantially the least figure of merit (FOM) among the remaining channels of the sub-band that includes the candidate channel, and determining the best channel among the candidate channels, to be used to transmit, based on the FOM of channels adjacent to each of the candidate channels. A predetermined threshold may be used to further select the best channel.

As known by one of ordinary skill in the art, this invention, including any logic circuit (block) or transistor circuit, may be modeled, generated, or both by computer based on a description of the hardware expressed in the syntax and the semantics of a hardware description language (HDL). Such HDL descriptions are often stored on a computer-readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

What is claimed is:

1. A scan system operative to receive signals within a band from an antenna comprising:
   a tuner operative to tune to two or more sub-bands within the band and operative to generate a tuned analog signal;
   an analog-to-digital converter (ADC) coupled to the tuner and operative to convert the tuned analog signal to a digital signal;
   an on-channel selection block responsive to the digital signal and operable to:
      select only the on-channel frequencies and to substantially disregard out-of-channel frequencies from the received signal,
      generate a first figure of merit (FOM) of an on-channel signal representing a measurement of the signal quality of the on-channel signal;
   an out-of-channel selection block responsive to the digital signal and operable to select only the out-of-channel frequencies and to substantially disregard the on-channel frequencies from the received signal and operable to:
   generate a second FOM of out-of-channel signal representing a measurement of the signal quality of the out-of-channel signal; and
   a finite state machine (FSM) responsive to the first FOM on-channel signal and the second FOM out-of-channel signal and operable to:
      record the first FOM from the on-channel selection block and the second out-of-channel selection block,
      perform an initial sub-band scan by comparing an initial FOM of each of the channels within an initial sub-band of the two or more sub-bands to determine a candidate channel based on the channel with the lowest FOM, the candidate channel subsequently used as a measure of comparison to channels of sub-bands other than the initial sub-band to identify and maintain a "best" channel.

2. The scan system as recited in claim 1, wherein the FSM is operable to select a channel with the best on-channel to out-of-channel FOM ratio, further wherein the FSM is operable to compare the on-channel to out-of-channel FOM ratio of candidate channels from each of the two or more sub-bands to determine a best channel that has the best on-channel to out-of-channel FOM ratio.

3. The scan system as recited in claim 2, wherein the FSM is operable to compare the on-channel to out-of-channel FOM ratio to a hysteresis range of thresholds having an upper range and a lower range, wherein the FOM ratio being above the range indicates that the channel is to be selected, and the FOM ratio being below the range indicates that the channel is not to be selected.

4. The scan system as recited in claim 2, wherein the FSM is coupled to an microcontroller unit (MCU), the MCU comprising:
   a channel frequency block operable to specify the start and stop frequency range and step frequency to be used by a user to select the sub-bands, and further comprising of a storage block operable to store a history of past best channel selections and associated quality measurement on-channel to out-of-channel FOM ratios, further wherein the storage block is operable to compare a previous best channel selection and its associated on-channel to out-of-channel FOM ratio with that of the current best channel selection and its associated on-channel to out-of-channel FOM ratio, and thereafter update the best channel selection accordingly.

5. The scan system as recited in claim 2, wherein the channel frequency block and storage block are executed on a separate platform.

6. The scan system as recited in claim 1, wherein the on-channel selection block includes an on-channel filter responsive to the digital signal and operable to generate an on-channel signal.

7. The scan system as recited in claim 6, wherein the on-channel selection block includes a FOM on-channel signal block responsive to the on-channel signal and operable to generate the received FOM on-channel signal.

8. The scan system as recited in claim 6, wherein the out-of-channel selection block includes a FOM out-of-channel signal block responsive to the out-of-channel signal and operable to generate the FOM out-of-channel signal.

9. The scan system as recited in claim 1, wherein the out-of-channel selection block includes an out-of-channel filter responsive to the received signal and operable to generate an out-of-channel signal.

10. The scan system as recited in claim 1, wherein the band is frequency modulation (FM) band.

11. The scan system as recited in claim 1, wherein the band is amplitude modulation (AM) band.

12. The scan system as recited in claim 1, wherein the band is wide band.

13. The scan system as recited in claim 1, wherein the first and second FOMs are each a received signal strength indicator (RSSI).

14. The scan system as recited in claim 1, wherein the first and second FOMs are each a signal-to-noise ratio (SNR).

15. The scan system as recited in claim 1, wherein the first and second FOMs are each a center frequency deviation.

16. A computer readable medium embodied in a computer program for scanning frequency band signals received from an antenna comprising:
   an tuner operable to tune to two or more sub-bands within the band and operable to generate a tuned analog signal;
   an analog-to-digital converter (ADC) coupled to the tuner and operable to convert the tuned analog signal to a digital signal;
   an on-channel selection block responsive to the digital signal and operable to select only the on-channel frequencies and to substantially disregard the out-band channel frequencies from the digital signal and further operable to generate a figure of merit (FOM) on-channel signal representing a measurement of the signal quality of the on-channel signal; and an out-of-channel selection block responsive to the digital signal and operable to select only the out-of-channel frequencies and to substantially disregard the on-channel frequencies from the digital signal to operable to generate a FOM out-of-channel signal representing a measurement of the signal quality of the out-of-channel signal; and a finite state machine (FSM) responsive to the FOM on-channel signal and the FOM out-of-channel signal and operable to record the FOM from the on-channel selection block and the out-of-channel selection block, the FSM further operable to perform an initial sub-band scan by comparing the first FOM of each of the channels within the initial sub-band to determine a candidate channel based on the channel with the lowest FOM, the candidate channel used as a measure of comparison to other channels subsequently to maintain the "best" channel.

17. A method of scanning a band for a vacant channel comprising:
   a) receiving signals;
   b) tuning to sub-bands within the band;
   c) generating a tuned analog signal;
   d) converting the tuned analog signal to a digital signal;
   e) selecting only the on-channel frequencies and substantially disregarding the out-band channel frequencies from the digital signal to generate an on-channel signal;
   f) generating a figure of merit (FOM) on-channel signal;
   g) selecting only the out-of-channel frequencies and substantially disregarding the on-channel frequencies from the digital signal to generate a out-of-channel signal; and
   h) generating a FOM out-of-channel signal.

18. A method of scanning a band for a vacant channel as recited in claim 17, further comprising:
   i) calculating a current best FOM on-channel ratio and FOM out-of-channel ratio associated with the best channel among the channels of the sub-bands; and
   j) recording the current best FOM on-channel ratio and FOM out-of-channel ratio.

19. A method of scanning a band for a vacant channel as recited in claim 18, further comprising:
   k) comparing the on-channel to out-of-channel FOM ratio to a threshold value and thereby determining if the channel will be selected.

20. A scan system operative to receive signals of a band from an antenna and to convert the signals into digital signals comprising:
    tuning means for generating digital signals for two or more sub-bands within a band;
    means responsive to digital signals for selecting on-channel frequencies thereof and for substantially disregarding the out-of-channel frequencies thereof and for generating a figure of merit (FOM) on-channel signal representing a measurement of the signal quality of the on-channel signal; and
    means responsive to the digital signal for selecting only the out-of-channel frequencies thereof and to substantially disregard the on-channel frequencies thereof and for generating a FOM out-of-channel signal representing a measurement of the FOM of the out-of-channel signal,
    means for selecting a candidate channel within each of the sub-bands based on the on-channel and out-of-channel FOM signals and further for selecting the best channel among the candidate channels within the sub-bands as being a vacant channel.

21. The scan system as recited in claim 20, further including a finite state machine (FSM) means responsive to the FOM on-channel signal and the FOM out-of-channel signal for selecting a channel with a best on-channel to out-of-channel FOM ratio, further wherein the FSM means for comparing the on-channel to out-of-channel FOM ratio of candidate channels from each of the sub-bands to determine a best channel that has the best on-channel to out-of-channel FOM ratio.

22. The scan system as recited in claim 20, wherein the FSM means for further comparing the on-channel to out-of-channel FOM ratio to a hysteresis range of thresholds having an upper range and a lower range, wherein the FOM ratio being above the range indicates that the channel is to be selected, and the FOM ratio being below the range indicates that the channel is not to be selected.

23. The scan system as recited in claim 20, wherein the FSM means is coupled to a microcontroller unit (MCU), the MCU comprising:
    a channel frequency block operable to specify the start and stop frequency range and step frequency to be used by a user to select the sub-bands, and further comprising a storage block operable to store a history of past best channel selections and associated FOM on-channel to out-of-channel ratios, further wherein the storage block is operable to compare a previous best channel selection and its associated FOM on-channel to out-of-channel ratio with that of the current best channel selection and its associated FOM on-channel to out-of-channel ratio, and thereafter updating the best channel selection accordingly.

24. A scan system operative to receive signals within a band from an antenna comprising:
    an on-channel selection block responsive to a received digital signal and operable to select only the on-channel frequencies and to substantially disregard the out-of-channel frequencies from the digital signal and operable to generate a FOM on-channel signal representing a measurement of the signal quality of the on-channel signal; and
    an out-of-channel selection block responsive to the digital signal and operable to select only the out-of-channel frequencies and to substantially disregard the on-channel frequencies from the digital signal and operable to generate a FOM out-of-channel signal representing a measurement of the signal quality of the out-of-channel signal.

25. The scan system as recited in claim 24, further including a finite state machine (FSM) responsive to the FOM on-channel signal and the FOM out-of-channel signal and operable to record the FOM measurements from the on-channel selection block and the out-of-channel selection block.

26. The scan system as recited in claim 25, wherein the FSM is operable to select a channel with the best on-channel to out-of-channel FOM ratio, further wherein the FSM is operable to compare the on-channel to out-of-channel FOM ratio of candidate channels from each of the sub-bands to determine a best channel that has the best on-channel to out-of-channel FOM ratio.

27. The scan system as recited in claim 26, wherein the FSM is operable to compare the on-channel to out-of-channel FOM ratio to a hysteresis range of thresholds having an upper range and a lower range, wherein the FOM ratio being above the range indicates that the channel is to be selected, and the FOM ratio being below the range indicates that the channel is not to be selected.

28. The scan system as recited in claim 25, wherein the FSM is coupled to a microcontroller unit (MCU), the MCU comprising:

a channel frequency block operable to specify the start and stop frequency range and step frequency to be used by a user to select the sub-bands, and further comprising a storage block operable to store a history of past best channel selections and associated FOM on-channel to out-of-channel ratios, further wherein the storage block is operable to compare a previous best channel selection and its associated quality measurement on-channel to out-of-channel ratio with that of the current best channel selection and its associated FOM on-channel to out-of-channel ratio, and thereafter updating the best channel selection accordingly.

29. The scan system as recited in claim 24, wherein FOM is a received signal strength indicator (RSSI).

30. The scan system as recited in claim 24, wherein FOM is a signal-to-noise ratio (SNR).

31. The scan system as recited in claim 24, wherein FOM is a center frequency deviation.

32. A scan system operative to receive signals within a band from an antenna, the band including one or more sub-bands, comprising:
    finite state machine (FSM) operative to scan channels of each of the sub-bands and to determine the channel with the least figure of merit (FOM) in each of the sub-bands defined as the candidate channel;
    an on-channel selection block responsive to a digital signal and operable to select only the on-channel frequencies from each of the candidate channels and to substantially disregard out-of-channel frequencies from the digital signal and operative to generate a FOM on-channel signal representing a measurement of the signal quality of the on-channel signal; and
    an out-of-channel selection block responsive to the digital signal and operable to select only the out-of-channel frequencies and to substantially disregard the on-channel frequencies from the digital signal and operable to generate a FOM out-of-channel signal representing a measurement of the signal quality of the out-of-channel signal.

33. The scan system as recited in claim 32, further including a finite state machine (FSM) responsive to the FOM on-channel signal and the FOM out-of-channel signal and operable to record the FOM from the on-channel selection block and the out-of-channel selection block.

34. The scan system as recited in claim 33, wherein the FSM is operable to select a channel with the best on-channel to out-of-channel FOM ratio, further wherein the FSM is operable to compare the on-channel to out-of-channel FOM ratio of candidate channels from each of the sub-bands to determine a best channel that has the best on-channel to out-of-channel FOM ratio.

35. The scan system as recited in claim 34, wherein the FSM is operative to compare the on-channel to out-of-channel FOM ratio to a hysteresis range of thresholds having an upper range and a lower range, wherein the FOM ratio being above the range indicates that the channel is to be selected, and the FOM ratio being below the range indicates that the channel is not to be selected.

* * * * *